United States Patent
Lyuksyutov et al.

(10) Patent No.: US 7,241,992 B1
(45) Date of Patent: Jul. 10, 2007

(54) METHOD OF AMPLITUDE MODULATED ELECTROSTATIC POLYMER NANOLITHOGRAPHY

(75) Inventors: Sergei F. Lyuksyutov, Akron, OH (US); Shane Juhl, Dayton, OH (US); Richard A. Vaia, Beavercreek, OH (US); Pavlo B. Paramonov, Akron, OH (US)

(73) Assignee: United States of America as represented by the Secretary of the Air Force, Washington, DC (US)

( * ) Notice: Subject to any disclaimer, the term of this patent is extended or adjusted under 35 U.S.C. 154(b) by 367 days.

(21) Appl. No.: 11/040,299

(22) Filed: Jan. 19, 2005

Related U.S. Application Data

(60) Provisional application No. 60/540,904, filed on Jan. 21, 2004.

(51) Int. Cl.
*G01N 13/16* (2006.01)
(52) U.S. Cl. .......................... 250/307; 250/306; 73/105
(58) Field of Classification Search .............. None
See application file for complete search history.

(56) References Cited

U.S. PATENT DOCUMENTS 5,666,190 A * 9/1997 Quate et al. .................. 355/71
5,729,026 A   3/1998 Mamin et al.
5,808,302 A   9/1998 Binnig et al.
5,856,967 A   1/1999 Mamin et al.
6,249,747 B1  6/2001 Binnig et al.
6,391,217 B2  5/2002 Schaffer et al.

OTHER PUBLICATIONS

Lyuksyutov et al., Copending Patent Application Subject to an Obligation of Common Assignment "Method of Polymer Nanolithography", AFD 654, U.S. Appl. No. 10/817,406, filed Mar. 25, 2004.

* cited by examiner

*Primary Examiner*—Nikita Wells
(74) *Attorney, Agent, or Firm*—AFMCLO/JAZ; Richard A. Lambert

(57) ABSTRACT

A method of amplitude modulated electrostatic polymer nanolithography providing rapid creation of features in a polymer film is disclosed. The nanolithography method of the present invention generates features by mass transport of polymer within an initially uniform, planar film via localized softening of attoliters ($10^2$-$10^5$ $nm^3$) of polymer by Joule heating enabling high data densities upon the surface of the polymer. This localized Joule heating is accomplished by current flow between the cantilever AFM tip and a conductive wafer upon which the layer of polymer is grown or mounted.

7 Claims, 3 Drawing Sheets

METHOD OF AMPLITUDE MODULATED ELECTROSTATIC POLYMER NANOLITHOGRAPHY

CROSS REFERENCE TO RELATED APPLICATIONS

The present application is related to and claims priority on now abandoned Provisional Application No. 60/540,904, filed Jan. 21, 2004, entitled Method of Amplitude Modulated Electrostatic Polymer Nanolithography.

RIGHTS OF THE GOVERNMENT

The invention described herein may be manufactured and used by or for the Government of the United States for all governmental purposes without the payment of any royalty.

BACKGROUND OF THE INVENTION

The present patent application is related to our copending patent application document "Method of Polymer Nanolithography", AFD 654, Ser. No. 10/817,406 filed on Mar. 25, 2004. The contents of that application are hereby incorporated by reference herein.

The present invention relates generally to nanolithography and specifically to a polymer electrostatic nanolithography method based upon amplitude modulated Atomic Force Microscopy.

The use of nano and micro-scale structuring of polymers, whether as a sacrificial, pattern-transfer layer or as the active component in a nano-device, is integral to nearly every aspect of future material fabrication. Two general areas of interest are polymer patterning for micro/nanofabrication and ultra dense data storage. It is known that a fundamental limitation for the density of magnetic storage media such as computer floppy disks and the like is the so-called superparamagnetic limit that is related to spin—spin interactions. Ultra compact data storage in thin polymer films is a promising alternative to ferromagnetic storage mediums because polymer data storage overcomes this fundamental limitation, enabling ultra dense storage.

Recent nanolithography investigations are based on the spatially selective removal or deposition of polymer. While somewhat successful, the prior art techniques are generally slow to perform. These techniques generally require chemical cross-linking, and/or substantial polymer degradation or ablation to effect. This permanently changes the composition and structure of the media itself, rendering it ineffective for repetitive data storage and retrieval applications.

A recent polymer nanolithography technique is described in U.S. Pat. No. 6,249,747 to Binning et al. The Binning device utilizes a cantilevered tip within an Atomic Force Microscope wherein an electrically conductive material is attached to the cantilever. In use, an electric current is applied to the electrically conductive material in the cantilever, heating the cantilever and the tip, in turn. The tip, thus heated, is selectively applied to a heat deformable film to create pits. The pits are utilized to convey information by the creation of a coherent structure. While this technique is somewhat effective, it has the disadvantage that a specialized tip is required and the application of current to heat the tip slows the overall lithographic process because the cantilever is large, requiring additional time to cool down.

A need exists therefore for a high speed polymer nanolithography method that facilitates rapid polymer feature creation without polymer degradation, cross-linking or removal. Such a method would enable reliable, high speed feature creation, and additionally provide for a ready erasure process and subsequent re-patterning of the polymer film.

SUMMARY OF THE INVENTION

Accordingly, it is a primary object of the present invention to provide a polymer nanolithography method overcoming the limitations and disadvantages of the prior art.

Another object of the present invention is to provide a polymer nanolithography method using conventional Atomic Force Microscopy (AFM) apparatuses and techniques.

Yet another object of the present invention is to provide a polymer nanolithography method providing rapid creation of features upon a polymer film.

It is still another object of the present invention to provide a polymer nanolithography method providing rapid creation of features without external heating of a polymer film or AFM tip-film contact.

In accordance with the foregoing principles and objects of the invention, a method of amplitude modulated electrostatic polymer nanolithography providing rapid creation of features in a polymer film is described. The nanolithography method of the present invention generates features by mass transport of polymer within an initially uniform, planar film via localized softening of attoliters ($10^2$-$10^5$ $nm^3$) of polymer by Joule heating enabling high data densities upon the surface of the polymer. This localized Joule heating is accomplished by current flow between the cantilever AFM tip and a conductive wafer upon which the layer of polymer is grown or mounted. This current flow between the tip and the conductive wafer imparts a strong electric field within the polymer to form features within the polymer film. Advantageously, the combination of extremely non-uniform electric field gradients to polarize and manipulate the softened polymer and single-step process methodology using conventional AFM equipment, facilitates rapid (less than one microsecond) creation of features without external heating of a polymer film or AFM tip-film contact. Additionally, the method of the present invention does not affect or remove the polymer material itself. The polymer can be readily returned to its pre-patterned state by a simple annealing process. This facilitates unlimited feature creation/erasure patterning cycles, rendering our invention amenable to repetitive processes such as data storage/retrieval applications.

The method of the present invention is an alternative to the polymer nanolithography method referenced in our copending patent application above. The present invention utilizes an amplitude modulated mode of operation to enhance control of the nanolithography process. Specifically, the AFM tip is driven by a piezo element to oscillate above the film. A voltage pulse having a period exceeding the oscillation period is applied to the tip. This applied voltage pulse creates Joule heating within the polymer to enable the creation of features on the surface. This amplitude modulated AFM technique provides great flexibility in controlling configuration of the tip surface junction as well as tip motion and its interaction with the polymer film thereby allowing a wider range of writing conditions and producing very small nanostructures with large aspect ratios.

BRIEF DESCRIPTION OF THE DRAWING

The accompanying drawing incorporated in and forming a part of the specification, illustrates several aspects of the present invention and together with the description serves to explain the principles of the invention. In the drawing.

DETAILED DESCRIPTION OF THE INVENTION

Figure 1A:
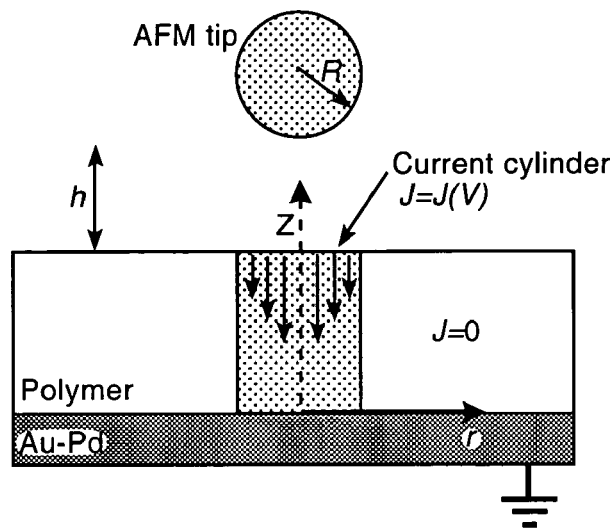
FIGS. 1a, 1b and 1c are diagrammatic representations of feature creation within the polymer film according to the teachings of the present invention.

Reference is made to the drawing figures diagrammatically illustrating the polymer nanolithography method of the present invention. Advantageously, the method of the present invention relies upon conventional Atomic Force Microscopy (AFM) equipment and techniques of operation.

Generally, conventional AFM techniques utilize a selectively positionable, flexible cantilever tip of very small size within an atomic force microscope that is moved relative to a surface to investigate and scan the surface. According to the method of the present invention, a highly conductive cantilever tip is utilized within conventional AFM equipment to effect the desired nanolithography. As will be described in more detail below, the nanolithography method of the present invention generates features by mass transport of polymer within an initially uniform, planar film via localized softening of attoliters ($10^2$-$10^5$ nm$^3$) of polymer by Joule heating. Advantageously, the features created according to the method of the present invention are exceedingly small, in the order of nanometers, enabling the storage and retrieval of enormous amounts of information within a very small area. This feature creation is accomplished without polymer cross-linking or removal as typify the techniques of the prior art. The nanoscale features formed by our invention can be easily removed by annealing the polymer again and again. That is, heating the material in the absence of an electric field, will cause it to soften and allow surface tension to smooth or erase the features earlier created. This renders our invention amenable to repetitive data storage and retrieval operations such as found, for example, in the computing art. Arrays of nanodots, as small as 10-50 nm wide by 1-10 nm high can be created by the method of the present invention enabling extremely high data densities.

The localized softening of the polymer is accomplished by current flow between the cantilever AFM tip and a conductive wafer upon which the layer of polymer is deposited, grown or mounted. This current flow between the tip and the conductive wafer instills a strong electric field within the polymer which can be manipulated to form raised or depressed features within the polymer film. The term polymer is used herein according to its ordinary meaning, referring to chain like molecules made up of large numbers of monomers. In common usage the term "polymer" is associated with plastics, but "polymers" can encompass many other types of materials such as biological and inorganic molecules. That is our intention since the method of the present invention has been successfully demonstrated on disparate types of polymers such as polystyrene, polymethylmethacrylate, DNA and the protein shells of viruses.

Advantageously, the method of the present invention has utility in a wide variety of applications such as enabling the exploration of materials at the atomic and molecular levels and providing the ability to sculpt and assemble structures on the nanoscale. Nano-structuring of polymers is crucial to many aspects of future material fabrication because of the emerging predominance of polymers in commercial and military applications such as molecular electronics, data storage, optoelectronics, displays, and sensors.

Figure 1B:
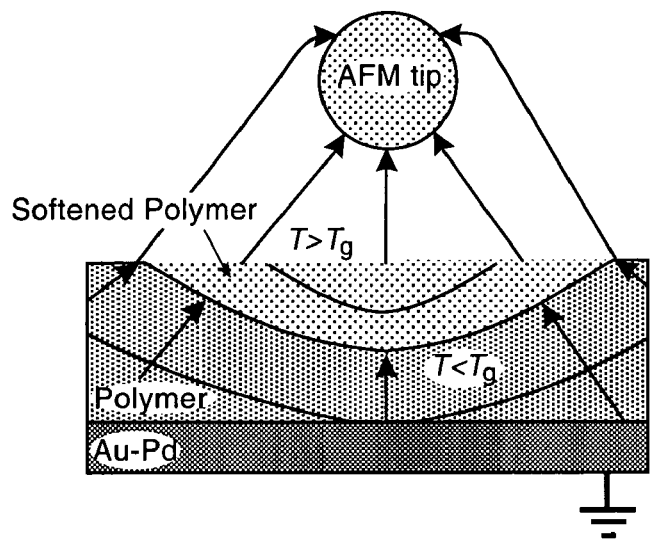
Figure 1C:
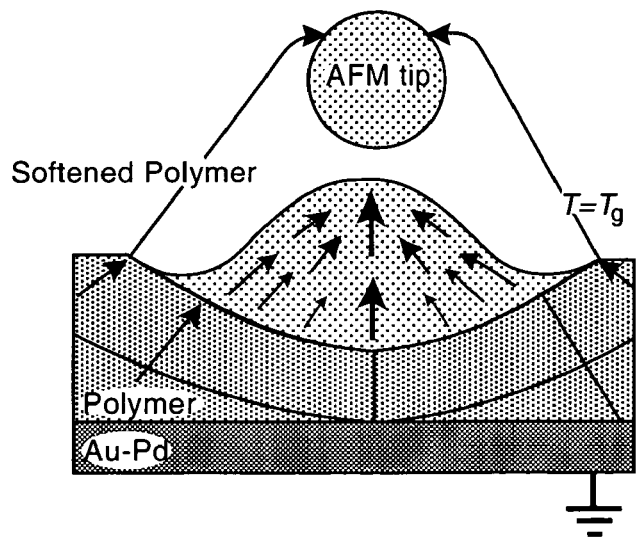

The method of the present invention can be practiced on any commercial AFM equipment capable of tapping mode operation. The present invention can be used to generate features by directed-mass transport of polymer material within an initially uniform, planar film. It is an advantage of the invention that the features are formed without chemical cross-linking, substantial polymer degradation, or ablation. A controlled bias through the thin polymer film (20-100 nm thickness) between the highly conductive cantilever tip and the conductive wafer underneath softens the polymer material directly under the AFM tip through localized Joule heating. As shown in FIGS. 1a, 1b, and 1c, features are generated in the film when the softened polymer is polarized and electrostatically attracted toward the AFM tip by the highly nonuniform electric field ($10^8$-$10^{10}$ V/m). Since the polymer does not deteriorate during the formation of the feature, a subsequent application of heat above the polymer's glass transition temperature $T_g$ will soften the entire film, enabling surface tension to erase the feature and re-construct the initially uniform film. Since the polymer itself is not affected, this feature creation/erasure process can be repeated over and over again substantially without limitation. It has been determined that maintaining a relative humidity level within the atomic force microscope between about 10 at about 70 percent provides the best results.

To provide additional insight into the processes underlying the method of the present invention, consider an idealized approximation of the initial writing geometry as a series of dielectric layers (air, polymer) between a conductive sphere (AFM cantilever tip) and conductive plane (Au—Pd layer), as shown diagrammatically in FIGS. 1a, 1b, and 1c. The geometrical details arising from the relative orientation of an AFM pyramidal tip with respect to the surface is, to a zero-order, subsumed into the spherical approximation of the tip. The electric field distribution inside the polymer film, estimated using the method of images, indicates that for moderate applied voltages (0-20V) at tip-surface separations of 1-5 nm, an enormously large electric field ($10^8$-$10^{10}$ V/m) exists directly under the AFM tip. Additionally, a very steep field gradient occurs in the immediate surrounding polymer where the electrostatic field decreases by a factor of 100-500 within a radius of the idealized AFM tip (R ~35 nm).

Conductivity, estimated from the Ohmic character of the i-V response assuming increased current flow occurs across an area comparable to the AFM tip diameter (2R=70 nm)) ranged from $10^{-4}$-$10^{-2}$ $(\Omega m)^{-1}$ for polymethylmethacrylate (PMMA) and $5 \times 10^{-4}$-$2 \times 10^{-1}$ $(\Omega m)^{-1}$ for polystyrene (PS). This is substantially greater than the conductivity for these polymers under moderate fields ($\sigma_{PMMA, 25° C.}$~$10^{-14}$ $(\Omega m)^{-1}$; $\sigma_{PS, 25° C.}$~$10^{-18}$ $(\Omega m)^{-1}$). It is believed that the flux of carriers may be generated due to water ionization inside a water meniscus around the AFM tip along with emission of electrons from the tip initiating dielectric breakdown in the polymer film. The extreme electric field estimated within the polymer is of the same order of magnitude as the intrinsic dielectric strength of many polymers ($10^9$ V/m for PMMA, $6 \times 10^8$ V/m for PS at 20° C.) creating conditions for the electric breakdown through the thin (20-100 nm) polymer films.

Current flow through the polymer film creates a stable, sustained temperature rise above the glass transition temperature, $T_g$ for a small fraction of the polymer under the AFM tip. This creates a localized region of a dielectric, viscoelastic 'liquid'. The large non-uniform electric field gradient surrounding the AFM tip will produce an electrostatic pressure, p(z), on this region of localized, polarizable softened polymer $$(T > T_g) \ of \ p(z) = \frac{\varepsilon_0(\varepsilon - 1)(\varepsilon + 2)}{6} E^2(z).$$

For representative fields (E=1–6×$10^9$ V/m) and polymer dielectric constant (ε=2.5), pressures of 10-360 MPa are estimated; comparable to the shear modulus of polymer melts. The electrostatic pressure gradient, directed towards the AFM tip, leads to feature formation. Estimating the feature formation process as a steady flow of a non-Newtonian incompressible liquid with a non-slip boundary, a 10-nm raised structure would form in 4.26 μsec. This is consistent with our own experimental observations of near instantaneous feature formation. Furthermore, feature formation should also be easier (faster and lower applied voltages) for lower molecular weight polymer, which exhibit lower $T_g$ and melt viscosity. This is again consistent with our experimentation where feature formation was more facile for 9.8K polystyrene relative to 110K polystyrene films.

Figure 2:
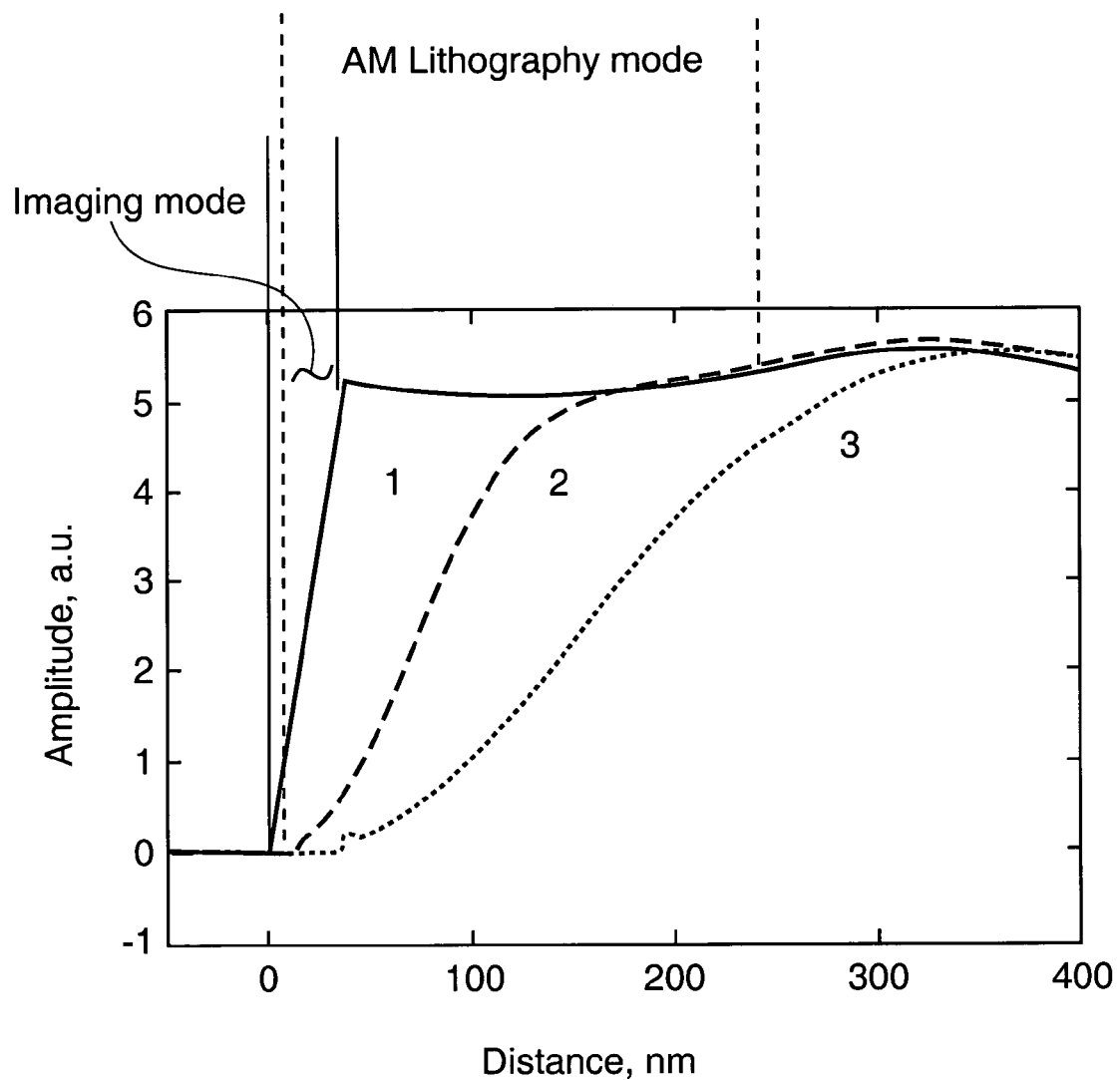
FIG. 2 is a graph illustrating the dependence of the oscillation amplitude of the tip with respect to tip-film separation without (curve 1: 0 V), and with bias voltages (curve 2: −9 V, curve 3: −18 V) for a 35 nm polystyrene film span on a conductive Au—Pd substrate according to the method of the present invention.

A schematic representation of the feature generation process according to the method of the present invention is shown in FIG. 1. An oscillatable conductive cantilever AFM tip is driven by a piezo-element driver to oscillate above the film at 200-400 kHz. The frequency range is determined by the resonant frequency of the cantilever tip. The commercially available K-TEK tip we used in practicing the invention has the above resonant frequency range. FIG. 2 presents typical amplitude-distance relationships for tip oscillation without (curve 1) and with (curves 2 and 3) negative bias when the tapping mode feedback loop has been disabled. In other words, when the feedback loop controller has been disabled, the piezo-element driver does not compensate for surface induced damping of the oscillation amplitude. Generally, the oscillation amplitude of an unbiased cantilever depends on the piezo-scanner driver voltage and frequency, as well as the mechanical and geometrical characteristics of the cantilever tip itself. At a critical distance, van-der-Waals and coulombic forces overcome the driving force of the piezo-scanner, rapidly decreasing the oscillation amplitude to zero (steep portion of curve 1). When the amplitude goes to zero, the tip is in contact with surface. It has been determined that with an applied negative DC bias between the tip and substrate, the influence of coulombic force advantageously extends the tip-surface interaction distance, impacting cantilever oscillation at greater distances (curves 2 and 3). It has also been determined that the extent of these additional interactions is proportional to the magnitude of the bias voltage (−10-50 V).

Advantageously, the extended range and oscillating character of tip-surface interactions have been demonstrated to improve process control. For 200-400 kHz oscillation, tip-surface contact is in the microseconds range, implying each tap is a discrete event. The pulsating character of the tip-surface interaction is believed to provide enhanced control over current injection and electronic breakdown of the film. Additionally, altering the cantilever oscillation frequency refines the ability to control thermal generation, and subsequent feature generation.

Figure 3:
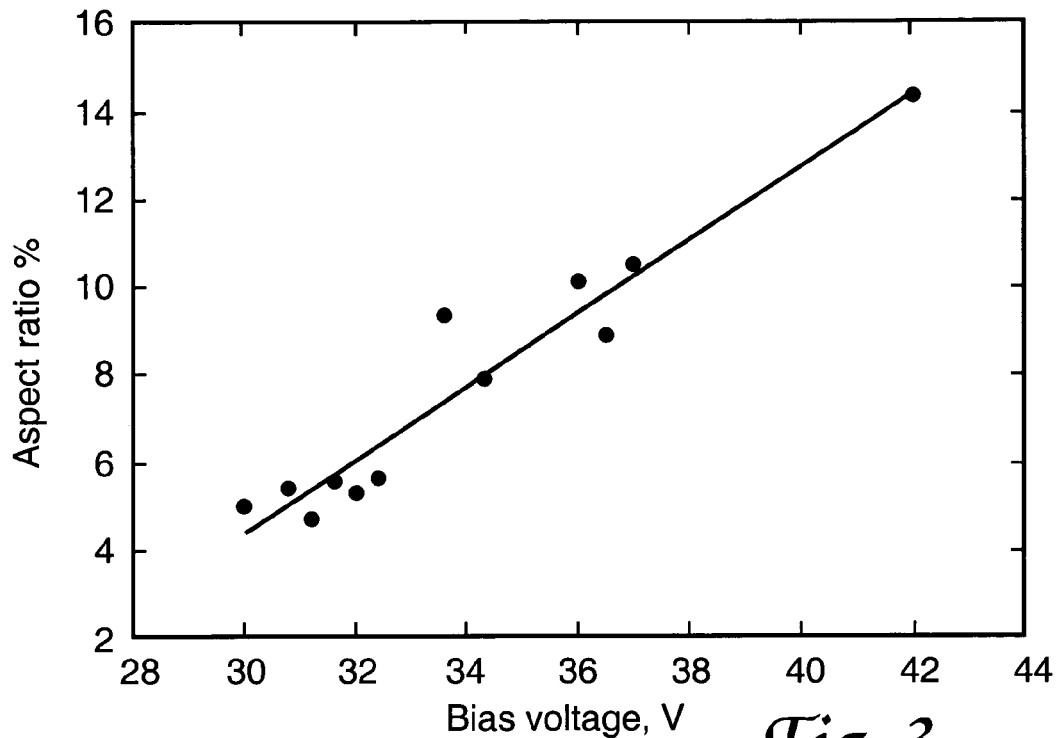
FIG. 3 is a graph illustrating the dependence of aspect ratio on the bias voltage for a 35 nm polystyrene film on a conductive Au—Pd substrate according to the method of the present invention.
Figure 4:
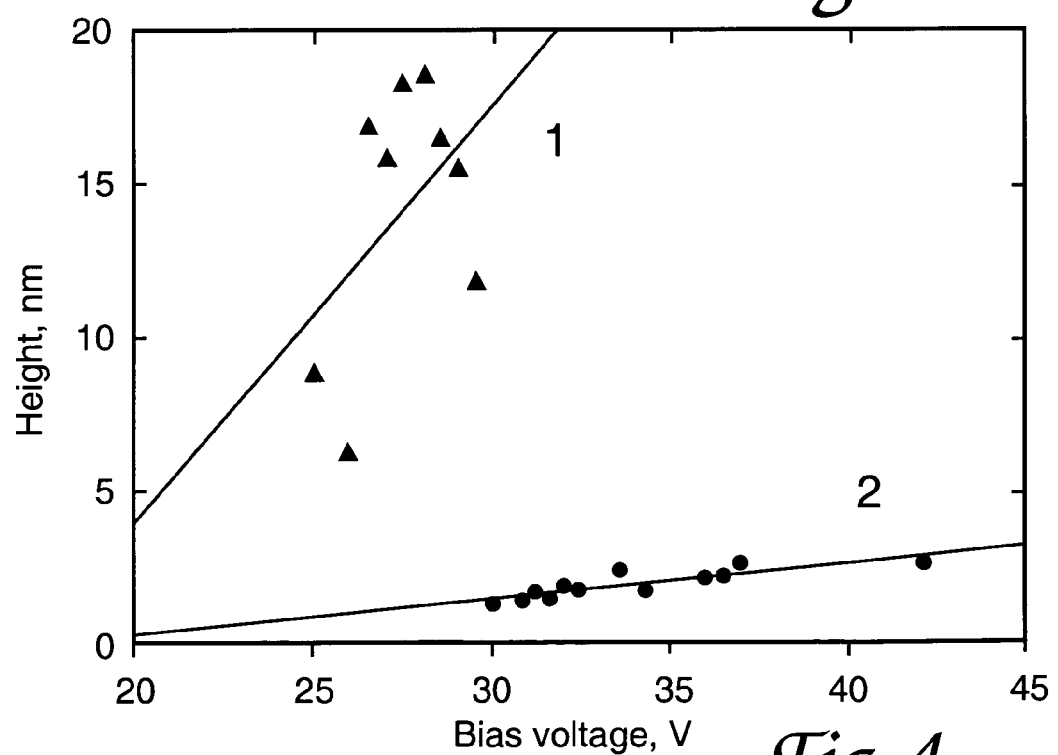
FIG. 4. is a graph illustrating nanodot feature height versus bias voltage in 35 nm polystyrene (curve 1) and polymethylmethacrylate (curve 2) films according to the method of the present invention.

The dependence on bias voltage of feature aspect ratio, and height of patterned nanodots in polystyrene and polymethylmethacrylate films is shown in FIGS. 3 and 4; curve 1 in FIG. 4 corresponding to polystyrene and curve 2 corresponding to polymethylmethacrylate. Although the polymers have slightly different physical-chemical properties, feature generation is very similar. The aspect (height-to-width) ratio of the nanostructures have been demonstrated to be as large as 0.1-0.2. The mostly asymmetric shape of the features depends on the magnitude and spatial distribution of the electric field near the tip. Additionally, the pulsating tip-surface distance is believed to mediate any catastrophic dielectric breakdown of the film.

As an example of the method of the present invention, a thin polymer layer of polystyrene (20-50 nm; roughness nominally less than 0.2 nm (tapping AFM imaging)) was spun cast onto a conductive Au—Pd film evaporated onto silicon. A small portion of the polymer film was removed to attach an electrode to the Au—Pd layer. Features were created using a Digital Instruments 3100 Dimensions AFM in amplitude modulated taping mode with a range of bias voltages between −5 and −50 V. Amplitude near the resonant frequency (200-400 kHz) of the cantilever of the highly conductive tungsten covered K-TEK tips was 10-50 nm. Electric current was monitored with a Keithley 6485 picoammeter. With the feedback loop controller (piezo-scanner) enabled, the tip was initially brought toward the polymer surface until the oscillation amplitude decreased to zero. This tip position is used as the initial reference point, setting the tip-film separation, d=0. The tip was then retracted, translated into position and tip-film separation is adjusted to the desired oscillation amplitude with the feedback loop controller (piezo-scanner) disabled. Finally, a DC voltage pulse, significantly exceeding the oscillation period (typically by the factors of $10^1$-$10^5$) is applied. While this example illustrates feature formation through the use of DC bias voltages, the method of the present invention may be satisfactorily used with AC voltage biases as well.

In summary, numerous benefits have been described from utilizing the principles of the present invention. The method of amplitude modulated electrostatic polymer nanolithography provides rapid creation of features in a polymer film generates features by mass transport of polymer within an initially uniform, planar film via localized softening of attoliters ($10^2$-$10^5$ nm$^3$) of polymer by Joule heating enabling high data densities upon the surface of the polymer. The features created are as small as 10-50 nm wide by 1-10 nm high, enabling extremely high data densities. Advantageously, the polymer itself is unaffected, enabling repetitive feature creation/erasure cycles, substantially without limitation on the number of cycles performed.

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

The invention claimed is:

1. A polymer nanolithography method, comprising the steps of:
   providing an atomic force microscope having tapping mode capability;
   providing an oscillatable conductive cantilever tip within said atomic force microscope, said cantilever tip including a piezo-element driver and a selectively operable feedback loop controller;
   providing a thin polymer film mounted upon a conductive wafer;
   installing said thin polymer film within said atomic force microscope;
   setting an initial tip-film reference point by enabling said feedback loop controller;
   disabling said feedback loop controller;
   oscillating said tip;
   forming nanoscale features upon said polymer film by applying a voltage pulse to said tip, said voltage pulse having a period exceeding the oscillation period of said tip.

2. The method of claim 1 wherein said setting step is preceded by the step of establishing a preselected relative humidity within said atomic force microscope in the range of 10-70 percent.

3. A polymer nanolithography method, comprising the steps of:
   providing an atomic force microscope having tapping mode capability;
   providing an oscillatable conductive cantilever tip within said atomic force microscope, said cantilever tip including a piezo-element driver and a selectively operable feedback loop controller;
   providing a thin polymer film mounted upon a conductive wafer;
   installing said thin polymer film within said atomic force microscope;
   setting an initial tip-film reference point by enabling said feedback loop controller;
   disabling said feedback loop controller;
   oscillating said tip;
   forming nanoscale features upon said polymer film by applying a voltage pulse to said tip, said voltage pulse having a period exceeding the oscillation period of said tip by a factor in the range of $10^1$-$10^5$.

4. The method of claim 3 wherein said setting step is preceded by the step of establishing a preselected relative humidity within said atomic force microscope in the range of 10-70 percent.

5. A polymer nanolithography method, comprising the steps of:
   providing an atomic force microscope having tapping mode capability;
   providing an oscillatable conductive cantilever tip within said atomic force microscope, said cantilever tip including a piezo-element driving element and a selectively operable feedback loop controller;
   providing a thin polymer film mounted upon a conductive wafer;
   installing said thin polymer film within said atomic force microscope;
   establishing a preselected relative humidity within said atomic force microscope;
   setting an initial tip-film reference point by enabling said feedback loop controller;
   retracting said tip;
   translating said tip into position relative to said polymer film for feature formation thereon;
   disabling said feedback loop controller;
   oscillating said tip;
   forming nanoscale features upon said polymer film by applying a voltage pulse to said tip, said voltage pulse having a period exceeding the oscillation period of said tip.

6. The method of claim 5 wherein said relative humidity level is within the range of 10-70 percent.

7. The method of claim 5 further including the step of erasing said polymer film by annealing at a temperature greater than $T_g$ for a sufficient time to remove said nanoscale features.

* * * * *